United States Patent
Yoshida et al.

(10) Patent No.: US 6,798,116 B2
(45) Date of Patent: Sep. 28, 2004

(54) PIEZOELECTRIC RESONATOR AND MANUFACTURING METHOD THEREOF

(75) Inventors: Ryuhei Yoshida, Toyama (JP); Kenichi Sakai, Toyama (JP)

(73) Assignee: Murata Manufacturing Co., LTD, Kyoto (JP)

( * ) Notice: Subject to any disclaimer, the term of this patent is extended or adjusted under 35 U.S.C. 154(b) by 122 days.

(21) Appl. No.: 10/323,660

(22) Filed: Dec. 20, 2002

(65) Prior Publication Data

US 2003/0151330 A1 Aug. 14, 2003

(30) Foreign Application Priority Data

Jan. 15, 2002 (JP) ........................................ 2002-006112
Dec. 11, 2002 (JP) ........................................ 2002-359613

(51) Int. Cl.[7] .............................................. H01L 41/08
(52) U.S. Cl. ..................... 310/320; 310/358; 310/366; 310/367; 310/365; 310/368
(58) Field of Search ................................ 310/320, 358, 310/365–368

(56) References Cited

U.S. PATENT DOCUMENTS 6,369,488 B1 * 4/2002 Ando et al. ................ 310/320
6,388,363 B1 * 5/2002 Kotani et al. ............... 310/320
6,458,287 B1 * 10/2002 Nishida et al. .......... 252/62.9 R
6,525,449 B1 * 2/2003 Wajima ...................... 310/365
6,621,194 B1 * 9/2003 Sugimoto et al. ........... 310/368

FOREIGN PATENT DOCUMENTS

JP    4-369914    12/1992

* cited by examiner

Primary Examiner—Thomas M. Dougherty
Assistant Examiner—J. Aguirrechea
(74) Attorney, Agent, or Firm—Keating & Bennett, LLP

(57) ABSTRACT

A method for producing an energy trap piezoelectric resonator which operates in a thickness longitudinal vibration mode and which includes a piezoelectric member and first and second vibrating electrodes disposed on respective major surfaces of the piezoelectric member, involves the use of a piezoelectric material having an R value and an A value which are selected such that $Qe=C/(R \times A)$, where R and A are the average pore size in micrometers and the porosity in percent of the piezoelectric member, respectively. Here, Qe is a value at a frequency to be used and C is a constant that is determined by the piezoelectric material of the piezoelectric member. An energy trap, thickness longitudinal piezoelectric resonator produced by this method has a sufficiently high response to a vibration mode to be used, without any limitation on the type of piezoelectric material and size of the piezoelectric member and the frequency to be used.

20 Claims, 3 Drawing Sheets

PIEZOELECTRIC RESONATOR AND MANUFACTURING METHOD THEREOF

BACKGROUND OF THE INVENTION

1. Field of the Invention

The present invention relates to a piezoelectric resonator used in, for example, an oscillator or a filter, and a method for manufacturing such a resonator. More specifically, the present invention relates to an energy-trap piezoelectric resonator operating in a thickness longitudinal vibration mode and a method for producing such a resonator.

2. Description of the Related Art

Conventionally, in order to form an oscillator or a piezoelectric filter, various types of piezoelectric resonators, such as a resonator using a fundamental wave in a thickness longitudinal vibration mode and a resonator using a higher mode, have been proposed. Piezoelectric resonators are required to have a high Qe value for a mode to be used, but a low Qe value for a spurious mode.

However, for, for example, a piezoelectric resonator using a third harmonic wave in a thickness longitudinal vibration mode, although methods for restricting a spurious wave in a mode that is of a lower order than a mode of, for example, a fundamental wave have been proposed, not many methods for restricting a higher-mode spurious wave have been proposed under present circumstances.

Japanese Unexamined Patent Application Publication No. 4-369914 proposes a piezoelectric ceramic resonator which can restrict a higher-mode spurious wave. Here, restriction of a dynamic range of resonance by a fifth harmonic wave having a frequency range that is greater than 20 MHz in a piezoelectric ceramic resonator having a frequency range of 12 MHz to 20 MHz and making use of resonance by a third harmonic wave in a thickness longitudinal vibration mode is proposed. More specifically, a piezoelectric ceramic material having an average crystal grain size of 3 $\mu$m to 5 $\mu$m, a maximum crystal grain size of 6 $\mu$m at most, a maximum pore size of 8 $\mu$m at most, and a porosity of 2% at most is used. By using this piezoelectric ceramic material, propagation of ultrasonic waves having a frequency that is greater than 20 MHz is restricted while ultrasonic waves having frequencies from 12 MHz to 20 MHz are properly propagated, so that the dynamic range of resonance by the fifth harmonic wave is restricted.

In the piezoelectric resonator disclosed in the aforementioned document, as described above, when a third harmonic wave in a thickness longitudinal vibration mode is used, the fifth harmonic spurious wave is restricted by restricting the dynamic range of the fifth harmonic wave in the thickness longitudinal vibration mode. However, as is clear from the above-described structure of this related technology, the document merely discloses that, when the frequency range of the third harmonic wave is from 12 MHz to 20 MHz and that of the fifth harmonic wave is greater than 20 MHz, it is effective to control the average crystal grain size, the maximum crystal grain size, the maximum pore size, and the porosity within the aforementioned respective particular ranges. In other words, the document does not disclose any method for restricting a spurious wave in a mode that is of a higher order than the mode that is used within various other frequency ranges. In addition, the document does not disclose any method for increasing the dynamic range of a resonant frequency that is used regardless of the frequency value.

SUMMARY OF THE INVENTION

In order to overcome the shortcomings and problems described above, preferred embodiments of the present invention provide a piezoelectric resonator which makes use of a thickness longitudinal vibration mode and which can, even if the piezoelectric resonator is formed of various piezoelectric materials and have various sizes, sufficiently increase the response to the thickness longitudinal vibration mode that is used, without limiting the frequency to a particular frequency, and also provide a method for manufacturing such a novel piezoelectric resonator.

Preferred embodiments of the present invention also provide a piezoelectric resonator which may be formed of various piezoelectric materials and may have various sizes, and which, not only has a sufficiently high response to a mode that is used, but also reliably restricts a higher-mode spurious wave.

In a first preferred embodiment of the present invention, a method for producing an energy trap piezoelectric resonator which operates in a thickness longitudinal vibration mode and which includes a piezoelectric member and a first vibrating electrode and a second vibrating electrode that are provided on respective major surfaces of the piezoelectric member and that overlap each other at a portion of the piezoelectric member includes the steps of forming the piezoelectric member using a piezoelectric material having an R value and an A value that are such that Qe=C/(R×A), where R represents the average pore size in micrometers, A represents the porosity in percent, Qe is a value at a target frequency, and C is a constant that is uniquely determined by the piezoelectric material of the piezoelectric member, and forming the first and second vibrating electrodes onto the respective major surfaces of the piezoelectric member.

In one preferred embodiment of the present invention, when Qe (S) is to be substantially equal to or less than Qe (max) and Qe at the target frequency is to be substantially equal to or greater than Qe (min), the piezoelectric member is formed using a piezoelectric material having an R value and an A value that are such that C (S)/Qe (max)≦(R×A) ≦C/Qe (min), where Qe (S) is a Qe value at a frequency of a spurious wave in a mode that is higher than a mode of a wave at the target frequency, Qe (max) is an upper limit of Qe (S), Qe (min) is a lower limit of Qe, and C (S) is a constant that is uniquely determined by the piezoelectric material and satisfies Qe (S)=C (S)/(R×A).

According to a second preferred embodiment of the present invention, an energy trap piezoelectric resonator which operates in a thickness longitudinal vibration mode includes a piezoelectric member made of a piezoelectric material having an R value and an A value that are such that Qe=C/(R×A), where R and A represent the average pore size in micrometers and the porosity in percent of the piezoelectric member, respectively, Qe is a value at a target frequency, and C is a constant that is uniquely determined by the piezoelectric material of the piezoelectric member, and a first vibrating electrode and a second vibrating electrode that are provided on respective major surfaces of the piezoelectric member and that partially oppose each other with the piezoelectric member disposed therebetween.

In one preferred embodiment of the present invention, when Qe (S) is to be equal to or less than Qe (max) and Qe at the target frequency is to be equal to or greater than Qe (min), the piezoelectric member includes a piezoelectric material having an R value and an A value that are such that C (S)/Qe (max)≦(R×A)≦C/Qe (min), where Qe (S) is a Qe value at a frequency of a spurious wave in a mode that is higher than a mode of a wave at the target frequency, Qe (max) is an upper limit of Qe (S), Qe (min) is a lower limit of Qe, and C (S) is a constant that is uniquely determined by the piezoelectric material and satisfies Qe (S)=C (S)/(R×A).

Other features, elements, steps, characteristics and advantages of the present invention will become more apparent from the following detailed description of preferred embodiments thereof with reference to the attached drawings.

DETAILED DESCRIPTION OF PREFERRED EMBODIMENTS

Hereinafter, for a better understanding of the present invention, specific preferred embodiments will be described with reference to the drawings.

Figure 1:
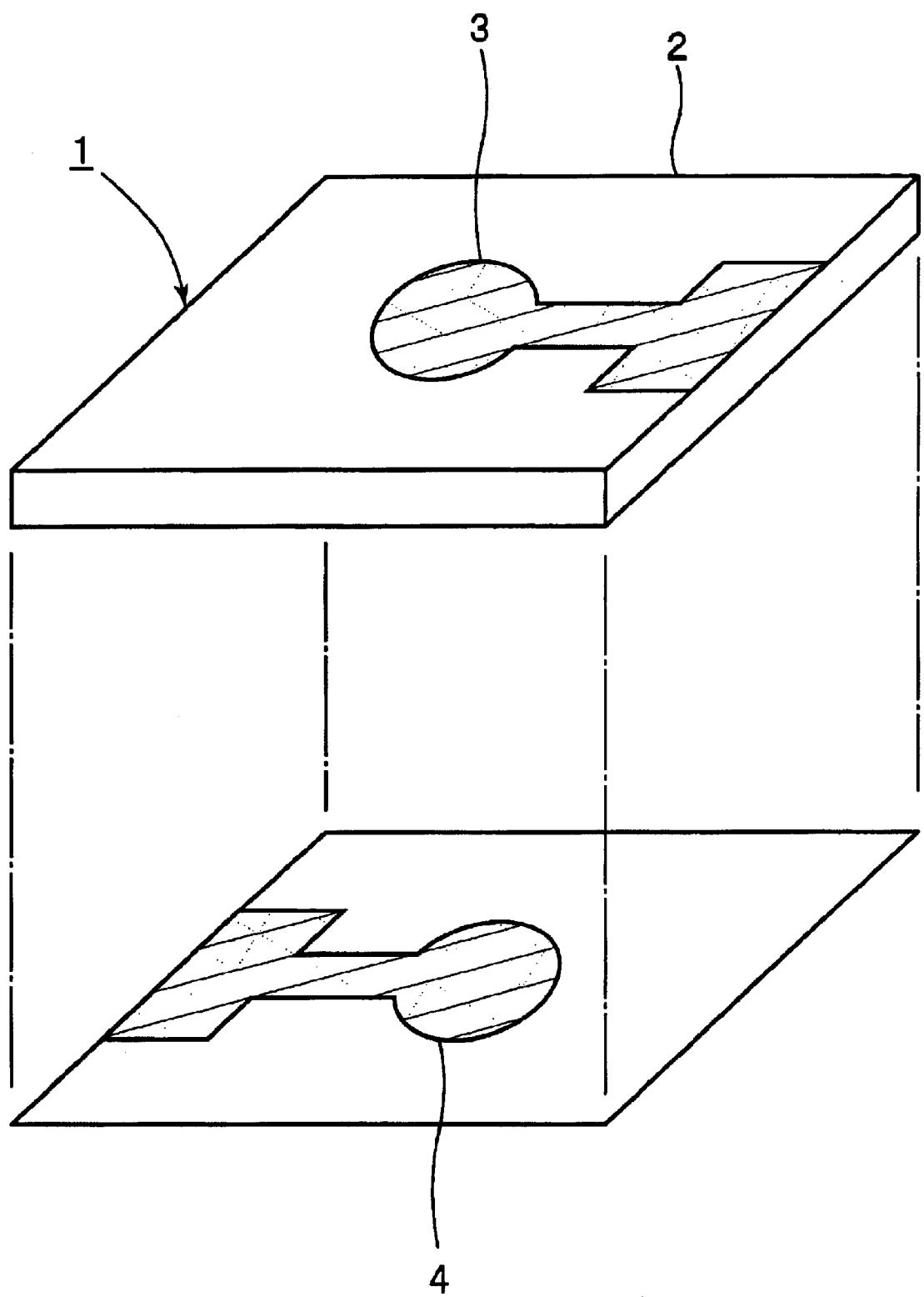
FIG. 1 is a schematic perspective view of a preferred embodiment of a piezoelectric resonator of the present invention.

FIG. 1 is a schematic perspective view of a preferred embodiment of a thickness longitudinal piezoelectric resonator of the present invention. A piezoelectric resonator 1 preferably includes a plate-shaped piezoelectric member 2 made of a proper piezoelectric ceramic such as a lead zirconate titanate type ceramic. The piezoelectric member 2 is polarized in the thickness direction. A first vibrating electrode 3 and a second vibrating electrode 4 are disposed on respective major surfaces of the piezoelectric member 2, oppose each other with the piezoelectric member 2 disposed therebetween, and are disposed on a portion of the top surface and a portion of the bottom surface of the piezoelectric member 2, respectively. Therefore, the opposing portions of the vibrating electrodes 3 and 4 define an energy trap piezoelectric vibrating section making use of a thickness longitudinal vibration mode.

The inventors of the present invention discovered that, in this type of piezoelectric resonator making use of a thickness longitudinal vibration mode, when a piezoelectric material of the piezoelectric member 2 has an average pore size of R (μm), a porosity of A(%), and a Qe value at a certain frequency f of Qe (f), R×A×Qe (f)=C. Accordingly, since Qe (f)=C/(R×A), a desired Qe value is obtained by selecting the average pore size R and the porosity A so that the relationship is satisfied.

C is a constant that is determined by the piezoelectric material.

Hereunder, the piezoelectric resonator 1 that is preferably made of $PbTiO_3$-type piezoelectric ceramic will be described in more detail with reference to FIG. 2.

Using a piezoelectric material including a $PbTiO_3$-type piezoelectric ceramic having main component that is $(Pb_{0.85}La_{0.1})TiO_3$ and including about 1.0 wt % of manganese (Mn) with respect to the weight of one mole of the main component, piezoelectric members having various average pore sizes R (μm) and porosities of A (%) due to changes in sintering conditions, molding conditions, etc. were provided. Each piezoelectric member was preferably formed with a size of, for example, approximately 4 mm×3 mm×0.5 mm, and first and second vibrating electrodes were formed on respective major surfaces of each piezoelectric member in order to produce piezoelectric resonators. The Qe value for a third harmonic wave (target frequency of 16 MHz) in a thickness longitudinal vibration mode of each piezoelectric resonator was measured. FIG. 2 is a plot of the Qe values versus R×A.

Figure 2:
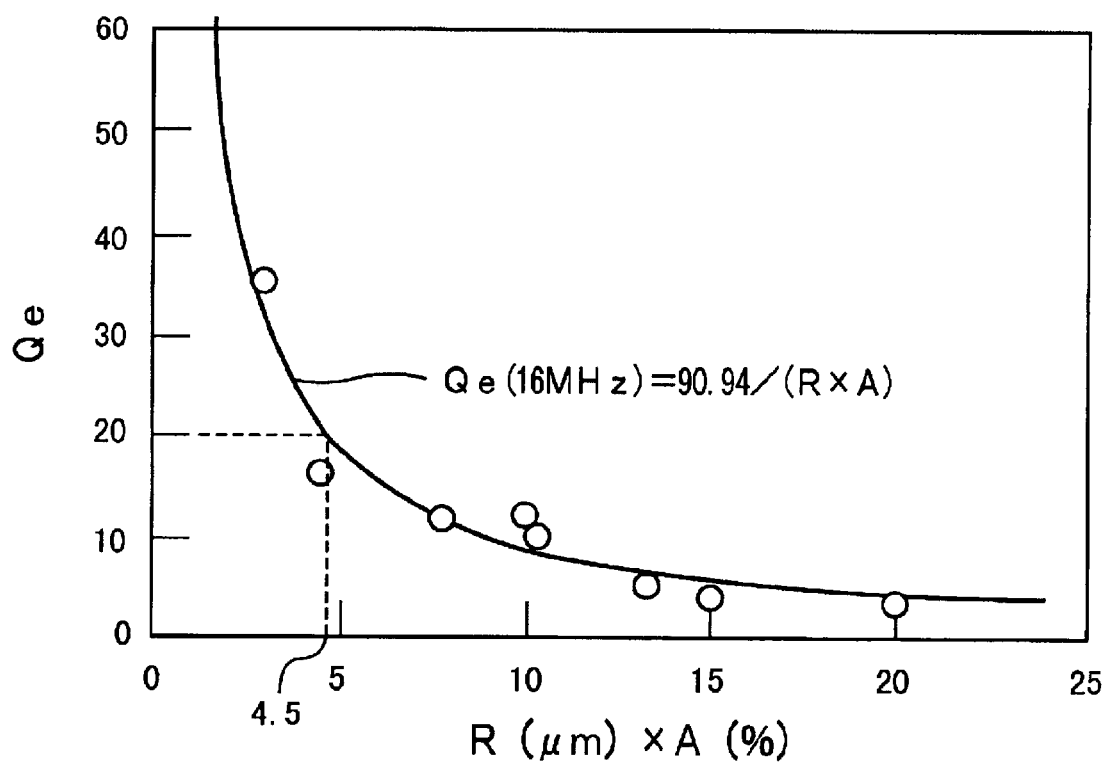
FIG. 2 is a graph showing the relationship between R×A and the Qe value for a third harmonic wave in a thickness longitudinal vibration mode when a piezoelectric member made of $PbTiO_3$-type piezoelectric ceramic including manganese (Mn) is used.

From the plot in FIG. 2, an approximate curve in which R×A×Qe(16 MHz)=90.94 is derived.

Therefore, at 16 MHz, that is, for resonance by the third harmonic wave in the thickness longitudinal vibration mode, when Qe(16 MHz) is to be equal to or greater than about 20, the R×A is set so that the condition Qe(16 MHz)=90.94/(R×A)≧20 is satisfied. More specifically, since (R×A)≦90.94/20=4.5, the R×A is preferably substantially equal to or less than about 4.5.

As described above, in the case where a $PbTiO_3$-type piezoelectric ceramic including Mn and a third harmonic wave (16 MHz) in a thickness longitudinal vibration mode are used, when the product of the average pore size R (μm) and the porosity A (%) of the $PbTiO_3$-type piezoelectric ceramic including Mn is selected so as to be equal to or less than about 4.5, a Qe value equal to or greater than about 20 can be reliably set.

Therefore, it can be understood that, in the present preferred embodiment, a required and desired Qe value can be reliably provided by merely controlling the average pore size R and the porosity A of the piezoelectric material that is used, so that a piezoelectric resonator having an excellent resonance characteristic is easily produced.

In producing the piezoelectric resonator 1, after providing the piezoelectric member 2 made of a piezoelectric material that is selected as mentioned above, the vibrating electrodes 3 and 4 are formed in accordance with a related method. The method for forming the vibrating electrodes 3 and 4 is not particularly limited, so that they may be formed by, for example, deposition, plating, sputtering, or applying conductive paste, or other suitable process.

The inventors of the present invention discovered that, according to preferred embodiments of the present invention, a higher-mode spurious wave can be easily restricted without decreasing the Qe value for the mode that is used. In other words, the relationship R×A×Qe (f)=a constant is true for all modes. Therefore, when, for example, as in the present preferred embodiment, a third harmonic wave in a thickness longitudinal vibration mode is used, the relationship Qe (third harmonic wave)=C(third harmonic wave)/(R×A) is true. Similarly, even for a higher-mode spurious wave, such as a fifth harmonic wave, the relationship R×A×Qe (fifth harmonic wave)=C(fifth harmonic wave) is true. As in the example for the third harmonic wave shown in FIG. 2, C for the fifth harmonic wave is a constant determined by the piezoelectric material, so that it differs from C for the third harmonic wave.

Here, when the lower limit of the Qe value required for the third harmonic wave is Qe (min) and the upper limit of the Qe value for the fifth harmonic wave to be restricted is Qe (max), the following conditions are established:

(R×A)≦C (third harmonic wave)/Qe (min)

(R×A)≧C (fifth harmonic wave)/Qe (max)

Therefore, C (fifth harmonic wave)/Qe (max)≦R×A≦C (third harmonic wave)/Qe (min). In other words, it can be understood that, by selecting the R value and the A value so that this last condition is satisfied, the Qe value for the third harmonic wave to be used is made sufficiently large, whereas the Qe value for the fifth harmonic spurious wave is small.

Figure 3:
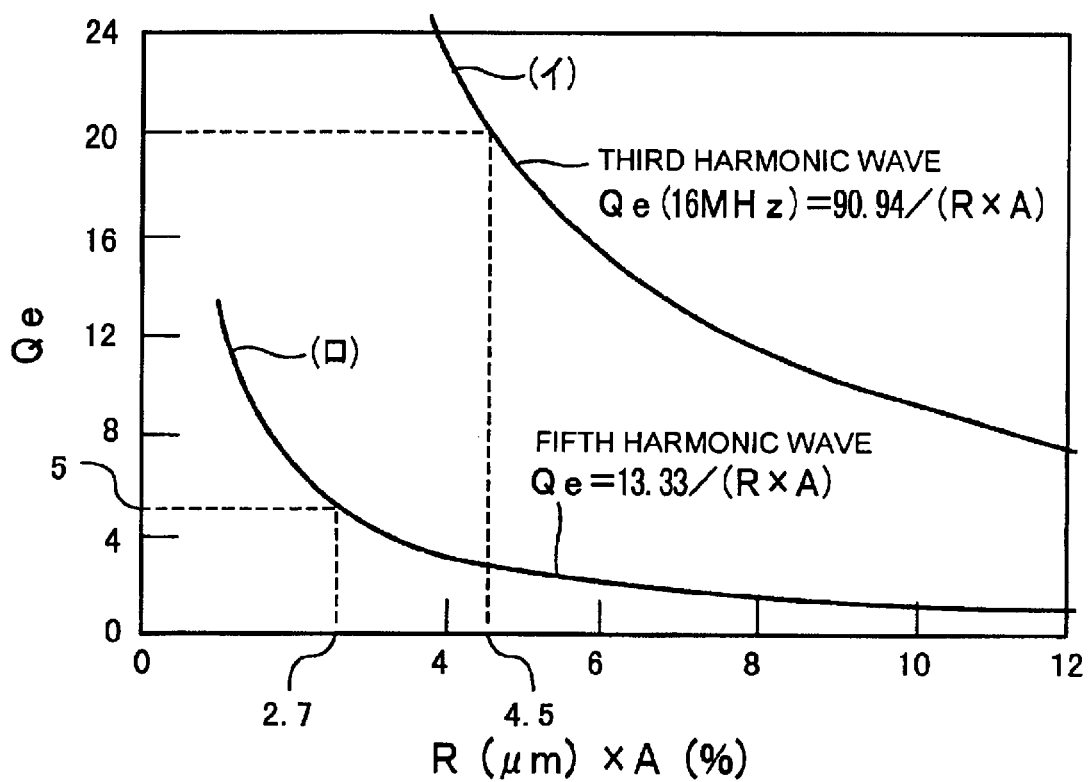
FIG. 3 is a graph showing the relationship between R×A and the Qe value for a fifth harmonic wave and a third harmonic wave in a thickness longitudinal vibration mode when a piezoelectric member made of $PbTiO_3$-type piezoelectric ceramic including manganese (Mn) is used.

This is described by taking as an example the case where a piezoelectric resonator 1 that uses a third harmonic wave in a thickness longitudinal vibration mode having a frequency of 16 MHz is produced using the $PbTiO_3$-type piezoelectric ceramic including Mn. FIG. 3 illustrates the relationship between R×A and the Qe value for the third harmonic wave and that between R×A and the Qe value for the fifth harmonic wave. In FIG. 3, a curve a represents the relationship for the third harmonic wave and a curve b represents the relationship for the fifth harmonic wave. From the curves a and b, C for the third harmonic wave is substantially equal to about 90.94, and C for the fifth harmonic wave is substantially equal to about 13.33. Therefore, for example, when Qe (min) for the third harmonic wave is to be equal to or greater than about 20, since Qe (third harmonic wave)=C (third harmonic wave)/(R×A) ≧20, (R×A)≦90.94/20=4.5, that is, (R×A) is substantially equal to or less than about 4.5. Similarly, when the Qe value for the fifth harmonic wave is to be substantially equal to or less than 5, since Qe (fifth harmonic wave)=C (fifth harmonic wave)/(R×A)≦5, R×A≧C (fifth harmonic wave)/5= 2.7, that is, R×A is substantially equal to or greater than about 2.7. Therefore, when the product of the average pore diameter R and the porosity A is in the range of about 2.7≦(R×A)≦ about 4.5, it is possible to provide a piezoelectric resonator which has a low response to a fifth harmonic wave and whose third harmonic wave is excited properly.

Although, in the present preferred embodiment, the case where the third harmonic wave is used and the fifth harmonic wave is a spurious wave is described as an example, the mode that is used and the higher mode that is restricted is not limited to the aforementioned combination. For example, when a fundamental wave is to be used, the third harmonic wave becomes a spurious wave. Even in this case, as described above, the R value and the A value are selected so that influence of the third harmonic wave is restricted while the fundamental wave is properly excited.

Although, in the description, the $PbTiO_3$-type piezoelectric ceramic including Mn is used as the piezoelectric ceramic, other types of ceramic may be used. For example, when other $PbTiO_3$-type piezoelectric ceramics or PZT-type piezoelectric ceramics are used, the relationship R×A×Qe=C is similarly true. Therefore, similarly, in energy trap piezoelectric resonators making use of a thickness longitudinal vibration mode formed of such piezoelectric materials, response to the mode to be used can be sufficiently increased, and, by making use of the relationships illustrated in FIG. 3, a higher-mode spurious wave can be easily restricted.

Although, in the present preferred embodiment, a piezoelectric resonator including a single piezoelectric resonating section is described, the present invention is also applicable to a piezoelectric resonator used in, for example, a filter including a plurality of thickness longitudinal piezoelectric resonating sections.

According to the method for producing the piezoelectric resonator of the first preferred embodiment of the present invention and the piezoelectric resonator of the second preferred embodiment of the present invention, it is possible to provide a piezoelectric resonator reliably having good response to the mode that is used by merely selecting a piezoelectric material having an average pore size R and a porosity A that are set so that R×A satisfies the relationship Qe=C/(R×A) in accordance with the Qe value at a target frequency.

According to the first and second preferred embodiments of the present invention, as described above, a wave can be properly excited in the mode that is used. In addition, not only can a higher-mode spurious wave be effectively restricted, but also frequencies to be used and sizes of the piezoelectric resonator are not limited. Therefore, the advantages of the present invention can be provided by piezoelectric resonators of various frequencies and sizes.

In the case where the Qe value for a higher-mode spurious wave is Qe (S), when the Qe (S) for the higher mode is to be substantially equal to or less than Qe (max), and the Qe value at the target frequency is to be substantially equal to or greater than Qe (min), a piezoelectric material having an R×A that is substantially equal to or greater than C (S)/Qe (max) but substantially equal to or less than C/Qe (min) is preferably used. By using such a material, the wave in the mode that is used is properly excited, and the higher-mode spurious wave can be effectively restricted, so that an even better resonance characteristic can be provided.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. An energy trap piezoelectric resonator which operates in a thickness longitudinal vibration mode, the resonator comprising:

a piezoelectric member comprising a piezoelectric material having R and A values that are such that satisfy the relationship Qe=C/(R×A), where R and A represent the average pore size in micrometers and the porosity in percent of the piezoelectric member, respectively, Qe is a value at a target frequency, and C is a constant that is uniquely determined by the piezoelectric material of the piezoelectric member; and a first vibrating electrode and a second vibrating electrode that are provided on major surfaces of the piezoelectric member and that partially oppose each other with the piezoelectric member disposed therebetween.

2. A piezoelectric resonator according to claim 1, wherein, when Qe (S) is to be equal to or less than Qe(max) and Qe at the target frequency is to be equal to or greater than Qe(min), the piezoelectric member includes a piezoelectric material having R and A values that satisfy the relationship C(S)/Qe (max)≦(R×A)≦C/Qe(min), where Qe(S) is a Qe value at a frequency of a spurious wave that is in a mode that is higher than a mode of a wave at the target frequency, Qe(max) is an upper limit of Qe(S), Qe(min) is a lower limit of Qe(S), and C(S) is a constant that satisfies the relationship Qe(S)=C(S)/(R×A) and is uniquely determined by the piezoelectric material.

3. A piezoelectric resonator according to claim 2, wherein the piezoelectric member comprises a piezoelectric ceramic.

4. A piezoelectric resonator according to claim 1, wherein the piezoelectric member comprises a piezoelectric ceramic.

5. An energy trap piezoelectric resonator according to claim 1, wherein the piezoelectric member includes at least one piezoelectric resonating section.

6. An energy trap piezoelectric resonator according to claim 1, wherein the piezoelectric material comprises $PbTiO_3$-type piezoelectric ceramic including Mn.

7. An energy trap piezoelectric resonator which operates in a thickness longitudinal vibration mode, the piezoelectric resonator comprising:

a piezoelectric member comprising a piezoelectric material wherein C satisfies the relationship C=Qe×(R×A), where R is the average pore size in micrometers, A is the porosity in percent, Qe is a value at a target resonant frequency of the piezoelectric resonator, and C is a constant that is uniquely determined by the piezoelectric material of the piezoelectric member, and in the care where wherein C(S) satisfies the relationship C(S)=Qe(S)×(R×A), wherein Qe(S) is a Qe value at a frequency of a spurious wave that is in a mode that is higher than a mode of a wave at the resonant frequency, and C(S) is a constant that is uniquely determined by the piezoelectric material of the piezoelectric member, when Qe(S) is equal to or less than Qe(max) and Qe is equal to or greater than Qe(min), where Qe(max) is an upper limit of Qe(S) and Qe(min) is a lower limit of Qe(S), the piezoelectric material having R and A values that satisfy the relationship C(S)/Qe(max)≦(R×A)≦C/Qe(min); and a first vibrating electrode and a second vibrating electrode provided on the respective major surfaces of the piezoelectric member and opposing each other through the piezoelectric member.

8. A piezoelectric resonator according to claim 7, wherein the piezoelectric member comprises a piezoelectric ceramic.

9. An energy trap piezoelectric resonator according to claim 7, wherein the piezoelectric member includes at least one piezoelectric resonating section.

10. An energy trap piezoelectric resonator according to claim 7, wherein the piezoelectric material comprises $PbTiO_3$-type piezoelectric ceramic including Mn.

11. A method for producing an energy trap piezoelectric resonator which operates in a thickness longitudinal vibration mode and which includes a piezoelectric member and a first vibrating electrode and a second vibrating electrode that are provided on respective major surfaces of the piezoelectric member and that overlap each other at a portion of the piezoelectric member, the method comprising the steps of:

forming the piezoelectric member using a piezoelectric material having R and A values that satisfy the relationship Qe=C/(R×A), where R represents the average pore size in micrometers, A represents the porosity in percent, Qe is a value at a target frequency, and C is a constant that is uniquely determined by the piezoelectric material of the piezoelectric member; and forming the first and second vibrating electrodes on the respective major surfaces of the piezoelectric member.

12. A method for producing a piezoelectric resonator according to claim 11, wherein, when Qe(S) is equal to or less than Qe(max) and Qe at the target frequency is equal to or greater than Qe(min), the piezoelectric member is formed using a piezoelectric material having R and A values that satisfy the relationship C(S)/Qe (max)≦(R×A)≦C/Qe(min), where Qe(S) is a Qe value at a predetermined frequency of a spurious wave in a mode that is higher than a mode of a wave at the target frequency, Qe (max) is an upper limit of Qe(S), Qe(min) is a lower limit of Qe(S), and C(S) is a constant that satisfies the relationship Qe(S)=C(S)/(R×A) and is uniquely determined by the piezoelectric material.

13. A method for producing a piezoelectric resonator according to claim 12, wherein the piezoelectric member comprises a piezoelectric ceramic.

14. A method for producing a piezoelectric resonator according to claim 11, wherein the piezoelectric member comprises a piezoelectric ceramic.

15. A method for producing an energy trap piezoelectric resonator according to claim 11, wherein the piezoelectric member includes at least one piezoelectric resonating section.

16. A method for producing an energy trap piezoelectric resonator according to claim 11, wherein the piezoelectric material comprises $PbTiO_3$-type piezoelectric ceramic including Mn.

17. A method for producing an energy trap piezoelectric resonator which operates in a thickness longitudinal vibration mode and which includes a piezoelectric member and a first vibrating electrode and a second vibrating electrode that are provided on respective major surfaces of the piezoelectric member and that overlap each other at a portion of the piezoelectric member, the method comprising the steps of:

determining C so that satisfies the relationship C=Qe×(R×A) by determining the values of R, and Qe, where R is the average pore size in micrometers, A is the porosity in percent, Qe is a value at a target resonant frequency of the piezoelectric resonator, and C is a constant that is uniquely determined by a piezoelectric material of the piezoelectric member, and determining C(S) so that satisfies the relationship C(S) Qe(S)=×(R×A) by determining Qe(S), where Qe(S) is a Qe value at a predetermined frequency of a spurious wave that is in a mode that is higher than a mode of a wave at the resonant frequency, and C(S) is a constant that is uniquely determined by the piezoelectric material of the piezoelectric member, wherein the value of Qe(S) is equal to or less than Qe(max) and Qe is equal to or greater than Qe (min), where Qe (max) is an upper limit of Qe(S) and Qe(min) is a lower limit of Qe(S);

forming the piezoelectric member using a piezoelectric material having R value and an A value that satisfy the relationship C(S)/Qe(max) ≦(R×A0≦C/Qe(min); and forming the first and second vibrating electrodes on the respective major surfaces of the piezoelectric member.

18. A method for producing a piezoelectric resonator according to claim 17, wherein the piezoelectric member comprises piezoelectric ceramic.

19. A method for producing an energy trap piezoelectric resonator according to claim 17, wherein the piezoelectric member includes at least one piezoelectric resonating section.

20. A method for producing an energy trap piezoelectric resonator according to claim 17, wherein the piezoelectric material comprises $PbTiO_3$-type piezoelectric ceramic including Mn.

* * * * *